US011852666B2

(12) United States Patent
Chen et al.

(10) Patent No.: US 11,852,666 B2
(45) Date of Patent: Dec. 26, 2023

(54) CIRCUIT AND METHOD FOR WIDTH MEASUREMENT OF DIGITAL PULSE SIGNALS

(71) Applicant: HUNAN GREAT-LEO MICROELECTRONICS CO., LTD., Hunan (CN)

(72) Inventors: Hu Chen, Hunan (CN); Ye Xu, Hunan (CN); Jianghua Wan, Hunan (CN)

(73) Assignee: HUNAN GREAT-LEO MICROELECTRONICS CO., LTD., Hunan (CN)

( * ) Notice: Subject to any disclaimer, the term of this patent is extended or adjusted under 35 U.S.C. 154(b) by 78 days.

(21) Appl. No.: 17/616,688

(22) PCT Filed: Apr. 25, 2021

(86) PCT No.: PCT/CN2021/089530
§ 371 (c)(1),
(2) Date: Dec. 6, 2021

(87) PCT Pub. No.: WO2021/227842
PCT Pub. Date: Nov. 18, 2021

(65) Prior Publication Data
US 2022/0308102 A1 Sep. 29, 2022

(30) Foreign Application Priority Data

May 14, 2020 (CN) .......................... 202010404936.6

(51) Int. Cl.
*G01R 29/02* (2006.01)
(52) U.S. Cl.
CPC .................. *G01R 29/023* (2013.01)
(58) Field of Classification Search
CPC .................................................. G01R 29/023
(Continued)

(56) References Cited

U.S. PATENT DOCUMENTS 8,384,440 B2   2/2013  Tessarolo et al.
2002/0114406 A1*  8/2002  Mashimo ............... G11B 20/10
                                                       375/322
(Continued)

FOREIGN PATENT DOCUMENTS

CN     1688889     10/2005
CN    102928677     2/2013
(Continued)

OTHER PUBLICATIONS

"International Search Report (Form PCT/ISA/210)" of PCT/CN2021/089530, dated Jul. 8, 2021, pp. 1-4.
(Continued)

*Primary Examiner* — Vincent Q Nguyen
(74) *Attorney, Agent, or Firm* — JCIP GLOBAL INC.

(57) ABSTRACT

Disclosed are circuit and method for width measurement of digital pulse signals. The circuit comprises: a sample clock, used to drive all registers in the circuit; an edge detection and interrupt control unit, used to detect a rising edge and a falling edge of a pulse signal on an input pin Input to control signal collection; an integer encoding unit comprising a counter and registers and used to measure an integer part µ of the width of a high or low level on the input pin Input with one period 1/f of the sample clock as a reference unit; a signal capture chain, used to sample an output level of each delay cell DLL; a decimal encoding unit, used to find out and record the propagation position of the pulse edge on the signal capture chain; and a calibration control unit, used to perform calibration.

10 Claims, 3 Drawing Sheets

(58) Field of Classification Search
USPC .......................................... 324/76.39, 76.77
See application file for complete search history.

(56) References Cited

U.S. PATENT DOCUMENTS

| | | | |
|---|---|---|---|
| 2003/0154043 A1 | 8/2003 | Singh | |
| 2008/0172193 A1* | 7/2008 | Rhee ................ | G01R 31/31709 |
| | | | 702/69 |
| 2010/0052651 A1 | 3/2010 | Kojima | |

FOREIGN PATENT DOCUMENTS

| | | |
|---|---|---|
| CN | 207232254 | 4/2018 |
| CN | 111693785 | 9/2020 |

OTHER PUBLICATIONS

"Written Opinion of the International Searching Authority (Form PCT/ISA/237)" of PCT/CN2021/089530, dated Jul. 8, 2021, pp. 1-6.

\* cited by examiner

CIRCUIT AND METHOD FOR WIDTH MEASUREMENT OF DIGITAL PULSE SIGNALS

CROSS REFERENCE TO RELATED APPLICATIONS

The application is a 371 of international application of PCT application serial no. PCT/CN2021/089530, filed on Apr. 25, 2021, which claims priority to Chinese Patent Application No. 202010404936.6, entitled "CIRCUIT AND METHOD FOR WIDTH MEASUREMENT OF DIGITAL PULSE SIGNALS", filed on May 14, 2020. The entirety of each of the above mentioned patent applications is hereby incorporated by reference herein and made a part of this specification.

BACKGROUND OF THE INVENTION

1. Technical Field

The invention mainly relates to the technical field of high-precision measurement of digital pulse signals, and more specifically, to a circuit and method for width measurement of digital pulse signals.

2. Description of Related Art

Signals of many industrial and consumer devices and instruments such as voltage signals, current signals, capacitive signals, speed signals, and distance signals need to be measured, and the measurement precision of these signals has a direct influence on the precision of the devices and instruments.

High-precision wide measurement of digital pulse signals has been widely used for pulse train period/duty cycle measurement, instantaneous speed measurement, voltage measurement across an isolation boundary, distance/sonar measurement and scanning, and capacitive touch sensing of precision instruments, sonar, servo robots, switching power supplies, power devices, and touch screens.

Digital signal processors perform signal measurement typically by quantifying voltage signals, capacitive signals, speed signals, and distance signals into digital pulse signals by analog-to-digital conversion and then measuring the digital pulse signals. As shown in FIG. 1, the width measurement of digital pulse signals is to represent the width of a pulse signal by a real number including an integer part and a decimal part by means of a sample clock (the frequency of which is f), with one clock period as a reference unit. In FIG. 1, the integer part is represented by $\mu$; the decimal part is generated due to misalignment of the edge of the pulse signal and the edge of the sample clock and is from the head and tail of a pulse, that is, $1-\alpha$, and $1-\beta$. In FIG. 1, the relationship between the width of a high-level pulse signal and f, $\mu$, $\alpha$ and $\beta$ is as follows:

$$\lambda = (\mu + 1 - \alpha - \beta) \times 1/f \quad (1)$$

The measurement precision of traditional digital signal measurement circuits is one period of the sample clock 1/f, so only the integer part $\mu$ of the signal width $\lambda$ can be measured, and the decimal part $1-\alpha-\beta$ of the signal width cannot be measured. To improve the measurement precision, the frequency of the sample clock has to be increased, thus greatly increasing the power consumption and complexity of hardware circuits.

For example, U.S. Pat. No. 8,384,440B2 fulfills the high-precision width measurement of pulse signals without a high-frequency sample clock. However, this method restricts the working range of the sample clock, requires an independent capture delay chain, and has to periodically perform a software calibration program, thus increasing software and hardware expenditures.

BRIEF SUMMARY OF THE INVENTION

The technical issue to be settled by the invention is to solve the technical problems of the prior art by providing a circuit and method for ultrahigh-precision width measurement of digital pulse signals, which are high in precision, simple in structure, and small in resource cost.

To settle the aforesaid technical issue, the invention adopts the following technical solution:

A circuit for width measurement of digital pulse signals, comprising:
 a sample clock used to drive all registers in the circuit;
 an edge detection and interrupt control unit used to detect a rising edge or a falling edge of a pulse signal on an input pin Input and to control signal sampling;
 an integer encoding unit comprising a counter and registers, and used to measure the integer part $\mu$ of a pulse of high or low level on the input pin Input, with one period 1/f of the sample clock as a reference unit;
 a signal capture chain comprising a group of delay cells DLL and capture registers CAP, wherein the number of the delay cells DLL is equal to the number of the capture registers CAP and is set as a positive integer i; and every time the signal on the input pin Input is propagated by one said delay cell, a delay will be produced and is set as $\delta$; the signal capture chain is used to sample the output level of each said delay cell DLL when a rising edge of a next sample clock arrives after the rising edge or the falling edge of the pulse signal on the input pin Input occurs;
 a decimal encoding unit used to find out and record a propagation position of the pulse edge on the signal capture chain according to a sample result of the signal capture chain; and
 a calibration control unit used to generate an internal input signal and sample control signals when the rising or falling edge of the signal on the input pin Input is detected, and control the signal capture chain to sample outputs of the delay cells DLL, wherein sample results are encoded and then saved in calibration registers, and step size information is calculated according to the calibration registers.

As a further improvement of the measuring circuit, during the interrupt control of the edge detection and interrupt control unit, an interrupt signal Interrupt is generated when the rising edge or the falling edge of the pulse signal on the input pin Input is detected to inform a master control device to read a pulse signal measurement result, and the measurement result is saved in registers in an integer encoding logic and a decimal encoding logic.

As a further improvement of the measuring circuit, the integer encoding logic comprises a counter Counter[n:1] and four registers CNTR1[n:1], CNTR2[n:1], CNTF1[n:1] and CNTF2[n:1]; the counter Counter[n:1] starts counting from 0 after an edge detection logic detects the pulse rising edge or falling edge; when the rising edge is detected, the counter Counter[n:1] is loaded to the register CNTR1[n:1] to record a measurement result before the rising edge arrives, the register CNTR1[n:1] is loaded to CNTR2[n:1], and the register CNTF1[n:1] is loaded to CNTF2[n:1]; and when the falling edge is detected, the counter Counter[n:1] is loaded to the register CNTF1[n:1] to record a measurement result before the falling edge arrives.

As a further improvement of the measuring circuit, the capture registers CAP are used to sample the output levels of the delay cells DLL when the rising edge of the next sample clock arrives after the rising edge or the falling edge of the pulse signal on the input pin Input occurs.

As a further improvement of the measuring circuit, the decimal encoding unit comprises an encoder R, an encoder F, encoding registers ENCR1[m:1], ENCR2[m:1], ENCF1 [m:1] and ENCF2[m:1], calibration registers CALR1[m:1] and CALR2 [m:1], and a step size register STEP [m:1]; the relationship between the number m of the encoding registers ENCR1[m:1] and the number i of the delay cells DLL in the signal capture chain is as follows:

$$m=\log_2 i.$$

As a further improvement of the measuring circuit, during edge detection, after the rising edge of the pulse signal on the input pin Input is detected, outputs of the capture registers CAP are encoded by the encoder R, and results are saved in the registers ENCR1[m:1]; and after the falling edge of the pulse signal is detected, outputs of the capture registers CAP are encoded by the encoder F, and results are saved in the registers ENCF1[m:1]; and when the rising edge is detected, the registers ENCR1[m:1] are loaded to ENCR2[m:1], and the registers ENCF1[m:1] are loaded to ENCF2[m:1].

As a further improvement of the measuring circuit, the calibration registers CALR1[m:1] and CALR2 [m:1] are used to record the propagation position of the pulse edge on the delay cell DLL chain under the control of the calibration control unit; a value of the step size register STEP [m:1] represents the number of delay cells, by which the signal on the input pin Input is propagated on the signal capture chain within one period 1/f of the sample clock, and STEP [m:1] is calculated according to the calibration registers CALR1 [m:1] and CALR2 [m:1].

As a further improvement of the measuring circuit, the relationship between a frequency f of the sample clock, the delay δ of the delay cells and the number i of the delay cells is as follows:

$$1/f < i \times \delta, \text{ wherein, } i \text{ is a positive integer.}$$

The invention further provides a method for width measurement of digital pulse signals, comprising:

Step S1: edge detection: generating pulse signals Rise, Fall, Rise_or_Fall, when an edge detection logic detects a rising edge or a falling edge of a pulse signal on an input pin Input. The pulse signals Rise, Fall, Rise_or_Fall are used to: 1) control the counter of a integer encoding unit to re-count from 0, 2) control the signal capture chain to sample output levels of DLL, 3) control the encoder R, F of a decimal encoding unit to encode the result of capture registers CAP;

Step S2: integer encoding: enabling a counter Counter[n: 1] to start counting from 0 after the pulse rising edge or falling edge is detected; when the rising edge is detected, loading the counter Counter[n:1] to a register CNTR1[n:1], loading the register CNTR1[n:1] to CNTR2[n:1], and loading the register CNTF1[n:1] to CNTF2[n:1]; when the falling edge is detected, loading the counter Counter [n:1] to the register CNTF1[n: 1];

Step S3: decimal encoding: encoding sample results in the capture registers CAP[i:1] when a rising edge of a next sample clock arrives after the rising edge or the falling edge of the pulse signal on the input pin Input occurs, to find out a propagation position of the pulse edge on a delay cell DLL chain;

Step S4: step size information calibration: monitoring step size information STEP[m:1], namely the number of delay cells, by which the signal on the input pin Input is propagated on a signal capture chain within one period 1/f of a sample clock;

Step S5: interrupt generation: generating, in an interrupt control logic, an interrupt on the rising edge or the falling edge of the signal on the input pin Input to inform a master control device to read a pulse signal measurement result; and Step S6: calculation: calculating, by software, a width of a high-level/low-level pulse before the interrupt according to information in the registers CNTR1[n:1], CNTR2[n:1], CNTF1 CNTF2[n:1], registers ENCR1 ENCR2[m:1], ENCF1 ENCF2[m:1], and a step size register STEP[m:1].

As a further improvement of the measuring method, Step S4 comprises:

Step S401: generation of an internal input signal and sample control signals: generating, by a calibration control logic, one internal input pulse signal and two sample control signals a period of time after the edge detection logic detects the rising edge of the signal on the input pin Input, wherein the internal input pulse signal is used as an input of the signal capture chain, and the sample control signals control times when the output levels of the delay cells DLL are sampled;

Step S402: sampling: sampling outputs of the delay cells DLL on the next rising edge of the sample clock HRCAPCLK after the sample control signals are generated, and saving results in the capture registers, wherein sampling is performed twice;

Step S403: encoding: encoding, by an encoder, the results of two times of sampling, and saving encoded results in calibration registers; and Step S404: calculation: setting a time interval between the two times of sampling as ω sample clock periods, wherein ω is a positive integer; and calculating STEP as follows $$STEP=(CALR1-CALR2)/\omega.$$

Compared with the prior art, the invention has the following advantages:

1. The circuit and method for width measurement of digital pulse signals of the invention has the advantages of high precision, simple structure, and small resource expenditure, and are able to accurately measure the widths of digital pulse signals without increasing the frequency of a sample clock. For example, the measurement precision may reach 100 ps when a 100 MHz sample clock is adopted.

2. The circuit and method for width measurement of digital pulse signals of the invention are able to dynamically calibrate the measurement precision according to changes of the actual working environment (such as the temperature or the working voltage), have a broad application range and high measurement precision, and do not introduce software overhead.

DETAILED DESCRIPTION OF THE INVENTION

The invention will be described in further detail below in conjunction with the accompanying drawings and specific embodiments of the invention.

Figure 2:
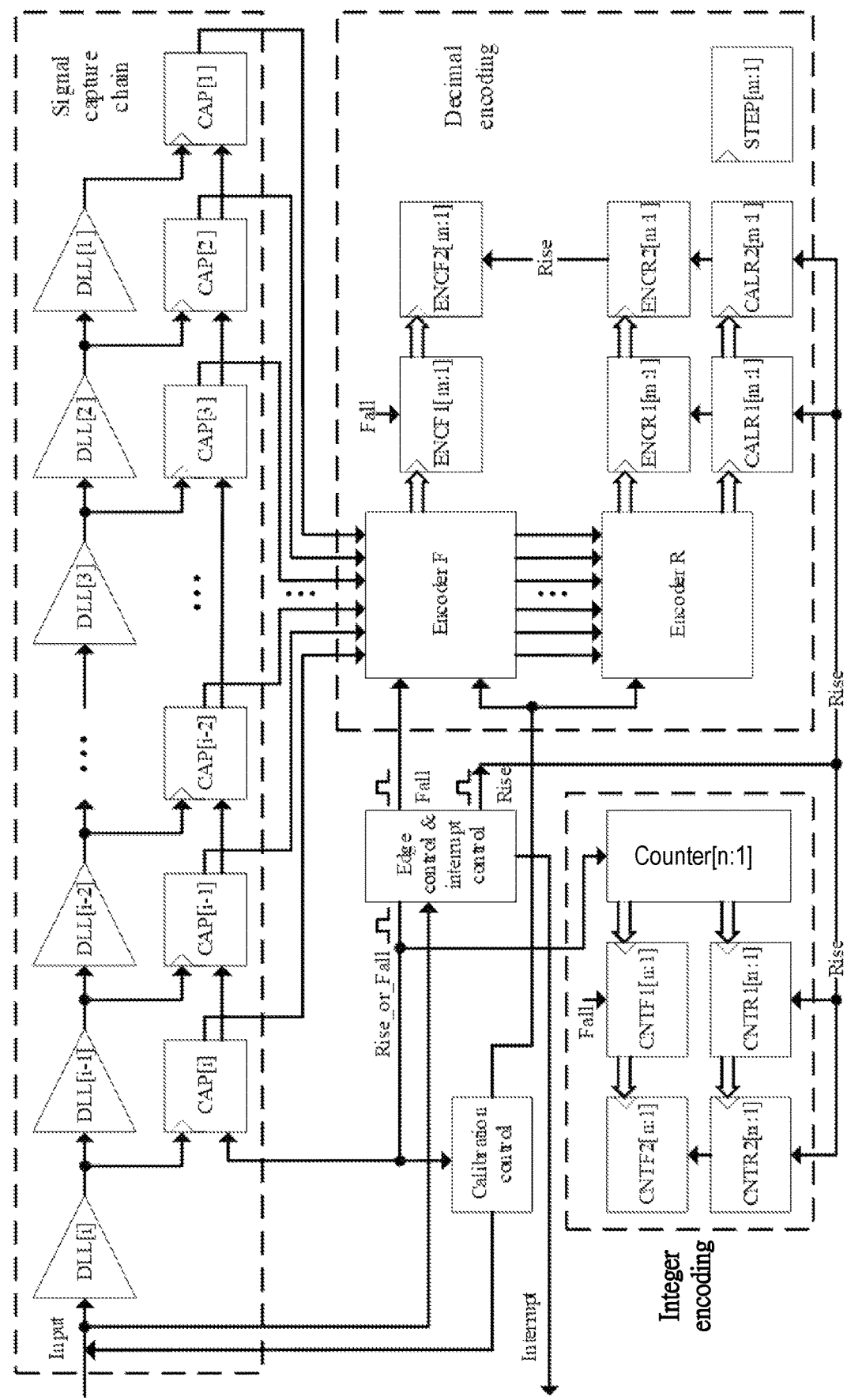
FIG. 2 is a structural principle diagram of a measurement circuit in a specific application example of the invention.

Refer to FIG. 2 which is a structural principle diagram of a circuit for ultrahigh-precision width measurement of digital pulse signals in a specific application example of the invention. For the sake of brevity, the connection relations between a sample clock and other circuits are not shown in FIG. 2, but this will not exert any influence on the understanding of the technical solution of the invention by those ordinarily skilled in the art or on the actual protection scope of the invention.

Figure 1:
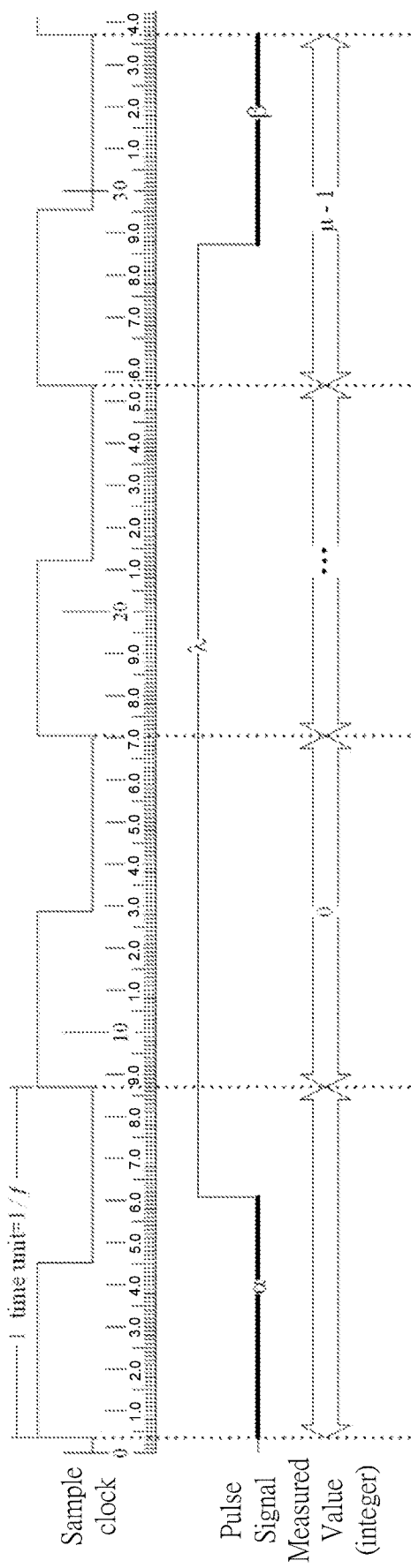
FIG. 1 is a principle diagram of the measurement of a digital pulse signal.

The circuit for ultrahigh-precision width measurement of digital pulse signals comprises an edge detection and interrupt control unit, an integer encoding unit, a signal capture chain, a decimal encoding unit, a calibration control unit, and a sample clock HRCAPCLK, wherein:

The sample clock HRCAPCLK is used to drive all registers in the circuit;

The edge detection and interrupt control unit is used to detect a rising edge and a falling edge of a pulse signal on an input pin Input to control signal sampling of the integer encoding unit, the decimal encoding unit, the calibration control unit and the signal capture chain; wherein, the rising edge of the pulse signal represents the beginning of a high level and the end of a low level, and the falling edge of the pulse signal represents the end of a high level and the beginning of a low level; and an output Rise, Fall, Rise_or_Fall indicates that a rising edge, a falling edge, or a rising or falling edge is detected;

The integer encoding unit is used to measure the integer part μ of the pulse of high or low level on the input pin Input, with one period 1/f of the sample clock HRCAPCLK as a reference unit;

The signal capture chain is used to sample an output level of each delay cell DLL when a rising edge of a next sample clock HRCAPCLK arrives after the rising edge or the falling edge of the pulse signal on the input pin Input occurs;

A decimal will be generated in a pulse width measurement result when the edge of the pulse signal on the input pin Input and the edge of the sample clock HRCAPCLK are not aligned; as shown in FIG. 1, the decimal is constituted by two parts: 1-α and 1-β; the decimal encoding unit is used to find out and record the propagation position of the pulse edge on the signal capture chain according to a sample result of the signal capture chain (capture registers CAP);

The calibration control unit is used to generate an internal input signal and sample control signals when the rising edge of the signal on the input pin Input is detected, and control the signal capture chain to perform two times of sampling on outputs of the delay cells DLL; results of the two times of sampling performed by the signal capture chain are encoded and then saved in calibration registers; step size information is calculated according to the calibration registers and is saved in a step size register.

In a specific application example, the aim of the interrupt control of the edge detection and interrupt control unit is to generate an interrupt signal Interrupt when the rising edge or the falling edge of the pulse signal on the input pin Input is detected to inform a master control device to read a pulse signal measurement result. The measurement result is saved in registers of an integer encoding logic and a decimal encoding logic.

In a specific application example, the integer encoding logic comprises a counter Counter[n:1] and four registers CNTR1[n:1], CNTR2[n:1], CNTF1[n:1] and CNTF2[n:1]. Wherein, the counter Counter[n:1] counts from 0 when an edge detection logic detects the pulse rising edge or falling edge. When the rising edge is detected, the counter Counter[n:1] is loaded to the register CNTR1[n:1] to record a measurement result before the rising edge arrives, the register CNTR1[n:1] is loaded to CNTR2[n:1], and the register CNTF1[n:1] is loaded to CNTF2[n:1]; and when the falling edge is detected, the counter Counter[n:1] is loaded to the register CNTF1[n:1] to record a measurement result before the falling edge arrives.

In a specific application example, the signal capture chain comprises a group of delay cells DLL and capture registers CAP. The number of the delay cells is equal to the number of the registers and is set as a positive integer i. Every time the signal on the input pin Input is propagated by one delay cell, a certain amount of delay will be produced and is set as δ. δ varies with the working environment of the circuit. For example, when the temperature rises or the working voltage decreases, δ will be increased; and when the temperature falls or the working voltage increases, δ will be decreased. The capture registers CAP are used to sample the output levels of the delay cells DLL when the rising edge of the next sample clock HRCAPCLK arrives after the rising edge or the falling edge of the pulse signal on the input pin Input occurs.

In a specific application example, the decimal encoding unit comprises an encoder R, an encoder F, encoding registers ENCR1[m:1], ENCR2[m:1], ENCF1[m:1] and ENCF2[m:1], calibration registers CALR1[m:1] and CALR2 [m:1], and a step size register STEP [m:1]. The relationship between the number m of the encoding registers ENCR1[m:1] and the number i of the delay cells DLL in the signal capture chain is as follows:

$$m = \log_2 i \tag{2}$$

In a specific application example, when the edge detection logic detects that the rising edge of the pulse signal on the input pin Input arrives, outputs of the capture registers CAP are encoded by the encoder R, and results are saved in the registers ENCR1[m:1]; and when the edge detection logic detects that the falling edge of the pulse signal arrives, outputs of the capture registers CAP are encoded by the encoder F, and results are saved in the registers ENCF1[m:1]. When the rising edge is detected, the registers ENCR1[m:1] are loaded to ENCR2[m:1], and the registers ENCF1[m:1] are loaded to ENCF2[m:1].

In a specific application example, the calibration registers CALR1[m:1] and CALR2 [m:1] are controlled by a calibration controller to record the propagation position of the pulse edge on the delay cell DLL chain. The value of the step size register STEP [m:1] represents the number of delay cells, by which the signal on the input pin Input is propagated on the signal capture chain within one period 1/f of the sample clock. STEP [m:1] is calculated according to the calibration registers CALR1[m:1] and CALR2 [m:1].

Because the delay δ of the delay cells DLL in the signal capture chain varies with the working environment of the circuit, to accurately represent the decimal part of the pulse measurement result, step size information STEP, namely the number of the delay cells, by which the signal on the input pin Input is propagated on the signal capture chain within one period 1/f of the sample clock, needs to be dynamically monitored. The calibration control unit is used to generate an internal input signal and sample control signals when the rising edge of the signal on the input pin Input is detected, to control the capture registers CAP to perform two times of sampling on the outputs of the delay cells DLL. Results of the two times of sampling performed by the capture registers CAP are encoded by the encoder R and are then saved in the calibration registers CALR1[m:1] and CALR2 [m:1]. The step information is calculated according to the calibration registers CALR1[m:1] and CALR2 [m:1], and results are saved in the step size register STEP [m:1].

In a specific application example, the relationship between the frequency f of the sample clock, the delay δ of the delay cells, and the number i of the delay cells is as follows:

$$1/f < i \times \delta, \text{ wherein, } i \text{ is a positive integer} \quad (3)$$

Figure 3:
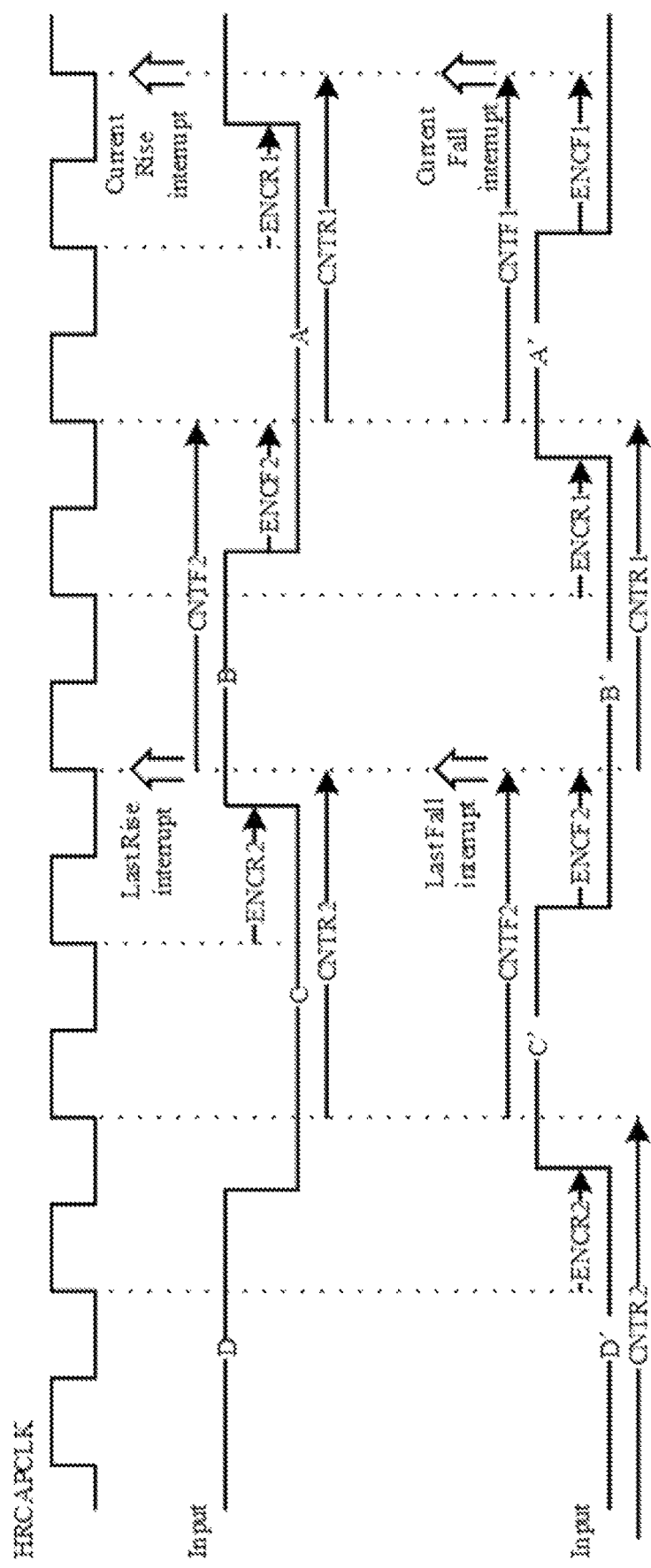
FIG. 3 is a principle diagram of a measurement method in a specific application example of the invention.

As shown in FIG. 3, the invention further provides a method for ultrahigh-precision wide measurement of digital pulse signals, comprising:

Step S1: edge detection: generating pulse signals Rise, Fall, Rise_or_Fall, when an edge detection logic detects a rising edge or a falling edge of a pulse signal on an input pin Input, wherein the pulse signal Rise, Fall, Rise_or_Fall is used to: (1) control Counter in an integer encoding unit to re-count from 0; (2) control a signal capture chain to sample output levels of DLL; and (3) control encoders R and F in a decimal encoding unit to encode results in capture registers CAP;

Step S2: integer encoding: enabling a counter Counter[n:1] to count from 0 when the pulse rising edge or falling edge is detected; when the rising edge is detected, loading the counter Counter[n:1] to a register CNTR1 [n:1], loading the register CNTR1[n:1] to CNTR2[n:1], and loading the register CNTF1[n:1] to CNTF2[n:1]; when the falling edge is detected, loading the counter Counter[n:1] to the register CNTF1[n:1];

Step S3: decimal encoding: encoding sample results in the capture registers CAP[i:1] when a rising edge of a next sample clock arrives after the rising edge or the falling edge of the pulse signal on the input pin Input occurs, to find out the propagation position of the pulse edge on a delay cell DLL chain;

Step S4: step size information calibration: monitoring step size information STEP[m:1], namely the number of delay cells, by which the signal on the input pin Input is propagated on a signal capture chain within one period 1/f of a sample clock;

Step S5: interrupt generation: generating, in an interrupt control logic, an interrupt on the rising edge or the falling edge of the signal on the input pin Input to inform a master control device to read a pulse signal measurement result; and Step S6: calculation: calculating, by software, the width of a high-level/low-level pulse before the interrupt according to information in the registers CNTR1[n:1], CNTR2[n:1], CNTF1[n:1], CNTF2 [n:1], registers ENCR1[m:1], ENCR2[m:1], ENCF1[m:1], ENCF2[m:1], and a step size register STEP[m:1].

In a specific application example, the ultrahigh-precision width measurement of digital pulse signals in the invention has a rising edge measurement mode and a falling edge measurement mode according to an edge where the interrupt occurs.

1) Rising Edge Measurement Mode

As shown in FIG. 3, in this mode, the widths of high-level and low-level pulses before the interrupt are respectively:

$$PWD\_H0 = PWD(B) = CNTR2 + (ENCF2 - ENCR2)/STEP \quad (4)$$

$$PWD\_L0 = PWD(A) = CNTR1 + (ENCR1 - ENCF2)/STEP \quad (5)$$

2) Falling Edge Measurement Mode

As shown in FIG. 3, in this mode, the widths of high-level and low-level pulses before the interrupt are respectively:

$$PWD\_H1 = PWD(C') = CNTF2 + (ENCF2 - ENCR2)/STEP \quad (6)$$

$$PWD\_H0 = PWD(A') = CNTF1 + (ENCF1 - ENCR1)/STEP \quad (7)$$

$$PWD\_L0 = PWD(B') = CNTR1 + (ENCR1 - ENCF2)/STEP \quad (8)$$

The aim of decimal encoding in this invention is to encode sample results (saved in capture registers CAP[i:1] obtained when the rising edge of the next sample clock HRCAPCLK arrives after the rising edge of the pulse signal on the input pin Input occurs;

That is, as can be known, in conjunction with the circuit in FIG. 2, that the encoder R and the encoder F are used to find out the propagation position of the pulse edge on the delay cell DLL chain according to sample results in the capture registers CAP[i:1], and encoded position information is saved in the registers ENCR1[m:1] and ENCF1[m:1].

The encoder R is used to encode the sample results in the capture registers CAP[i:1].

In a specific application example, the encoding rule is:

$$\forall x \in (i, i-1, \ldots, 2, 1), \text{ if } \exists x \text{ meets } \Sigma_i^{x+1} CAP[i]=1, \text{ and } CAP[i]=0:$$

$$ENCR1[m:1]=x \quad (9)$$

The encoder F is used to encode the sample results in the capture registers CAP[i:1].

In a specific application example, the encoding rule is:

$$\forall x \in (i, i-1, \ldots, 2, 1), \text{ if } \exists x \text{ meets } \Sigma_i^{x+1} CAP[i]=0, \text{ and } CAP[i]=1:$$

$$ENCF1[m:1]=x \quad (10)$$

The process of step size information calibration in the invention is as follows:

Step S401: generation of an internal input signal and sample control signals: generating, by a calibration control logic, one internal input pulse signal and two sample control signals a period of time after the edge detection logic detects the rising edge of the signal on the input pin Input, wherein the internal input pulse signal is used as an input of the signal capture chain, and the sample control signals control times when the output levels of the delay cells DLL are sampled;

Step S402: sampling: sampling outputs of the delay cells DLL on the next rising edge of the sample clock HRCAPCLK after the sample control signals are generated, and saving results in the capture registers CAP [i:1], wherein sampling is performed twice;

Step S403: encoding: encoding, by the encoder R, the results of two times of sampling, and saving encoded results in calibration registers CALR1[m:1] and CALR2 [m:1], respectively; and Step S404: calculation: setting a time interval between the two times of sampling as ω sample clock periods, wherein ω is a positive number; and calculating STEP as follows:

$$STEP=(CALR1-CALR2)/\omega \qquad (11).$$

The above embodiments merely illustrate preferred implementations of the invention, and are not intended to limit the protection scope of the invention. All technical solutions based on the concept of the invention should also fall within the protection scope of the invention. It should be noted that various improvements and embellishments made by those ordinarily skilled in the art without departing from the principle of the invention should also fall within the protection scope of the invention.

What is claimed is:

1. A circuit for width measurement of digital pulse signals, characterized by comprising:
   a sample clock, used to drive all registers in the circuit;
   an edge detection and interrupt control unit, used to detect a rising edge or a falling edge of a pulse signal on an input pin Input and to control signal sampling;
   an integer encoding unit, comprising a counter and integer encoding registers of the registers, and used to measure an integer part μ of a high level or a low level of the pulse signal on an input pin Input, with one period 1/f of the sample clock as a reference unit;
   a signal capture chain, comprising a group of delay cells DLL and capture registers CAP of the registers, wherein the number of the delay cells DLL is equal to the number of the capture registers CAP and the number of the delay cells DLL is set as a positive integer i; and every time the signal on the input pin Input is propagated by one of said delay cells, a delay will be produced and is set as δ; the signal capture chain is used to sample an output level of each of the outputs of said delay cell DLL when a rising edge of a next sample clock arrives after the rising edge or the falling edge of the pulse signal on the input pin Input occurs;
   a decimal encoding unit, used to find out and record a propagation position of a pulse edge on the signal capture chain according to a sample result of the signal capture chain; and
   a calibration control unit, used to generate an internal input signal and a sample control signal when the rising edge or the falling edge of the signal on the input pin Input is detected, and control the signal capture chain to sample the outputs of the delay cells DLL, wherein sample results are encoded and then saved in calibration registers of the registers, and step size information is calculated according to the calibration registers,
   wherein the decimal encoding unit is coupled to the signal capture chain, the detection and interrupt control unit, and the integer encoding unit, wherein during an interrupt control of the edge detection and interrupt control unit, an interrupt signal Interrupt is generated when the rising edge or the falling edge of the pulse signal on the input pin Input is detected to inform a master control device to read a pulse signal measurement result, and the measurement result is saved in the registers in the integer encoding unit and the decimal encoding unit.

2. The circuit for width measurement of digital pulse signals according to claim 1, characterized in that wherein the integer encoding unit comprises a counter Counter[n:1] and four registers CNTR1[n:1], CNTR2[n:1], CNTF1[n:1] and CNTF2[n:1]; the counter Counter[n:1] starts counting from 0 after an edge detection logic detects the pulse rising edge or falling edge; when the rising edge is detected, the counter Counter[n:1] is loaded to the register CNTR1[n:1] to record a measurement result before the rising edge arrives, the register CNTR1[n:1] is loaded to CNTR2[n:1], and the register CNTF1[n:1] is loaded to CNTF2[n:1]; and when the falling edge is detected, the counter Counter[n:1] is loaded to the register CNTF1[n:1] to record a measurement result before the falling edge arrives.

3. The circuit for width measurement of digital pulse signals according to claim 2, wherein the capture registers CAP are used to sample the output levels of the delay cells DLL when the rising edge of the next sample clock arrives after the rising edge or the falling edge of the pulse signal on the input pin Input occurs.

4. The circuit for width measurement of digital pulse signals according to claim 2, wherein the decimal encoding unit comprises an encoder R, an encoder F, encoding registers ENCR1[m:1], ENCR2[m:1], ENCF1[m:1] and ENCF2[m:1], calibration registers CALR1[m:1] and CALR2 [m:1], and a step size register STEP [m:1]; the relationship between the number m of the encoding registers ENCR1[m:1] and the number i of the delay cells DLL in the signal capture chain is as follows:

$$m=\log_2 i.$$

5. The circuit for width measurement of digital pulse signals according to claim 2, wherein the relationship between a frequency f of the sample clock, the delay δ of the delay cells and the number i of the delay cells is as follows:

$$1/f < i \times \delta, \text{ wherein } i \text{ is a positive integer.}$$

6. The circuit for width measurement of digital pulse signals according to claim 1 characterized in that wherein the capture registers CAP are used to sample the output levels of the delay cells DLL when the rising edge of the next sample clock arrives after the rising edge or the falling edge of the pulse signal on the input pin Input occurs.

7. The circuit for width measurement of digital pulse signals according to claim 1 characterized in that wherein the decimal encoding unit comprises an encoder R, an encoder F, encoding registers ENCR1[m:1], ENCR2[m:1], ENCF1[m:1] and ENCF2[m:1], calibration registers CALR1[m:1] and CALR2 [m:1], and a step size register STEP [m:1]; the relationship between the number m of the encoding registers ENCR1[m:1] and the number i of the delay cells DLL in the signal capture chain is as follows:

$$m=\log_2 i.$$

8. The circuit for width measurement of digital pulse signals according to claim 7, characterized in that wherein during edge detection, after the rising edge of the pulse signal on the input pin Input arriving is detected, outputs of the capture registers CAP are encoded by the encoder R, and results are saved in the registers ENCR1[m:1]; and after the falling edge of the pulse signal arriving is detected, outputs of the capture registers CAP are encoded by the encoder F, and results are saved in the registers ENCF1[m:1]; and when the rising edge is detected, the registers ENCR1[m:1] are loaded to ENCR2[m:1], and the registers ENCF1[m:1] are loaded to ENCF2[m:1].

9. The circuit for width measurement of digital pulse signals according to claim 7, characterized in that wherein the calibration registers CALR1[m:1] and CALR2 [m:1] are used to record the propagation position of the pulse edge on the delay cell DLL chain under the control of the calibration control unit; a value of the step size register STEP [m:1] represents the number of delay cells, by which the signal on the input pin Input is propagated on the signal capture chain within one period 1/f of the sample clock, and STEP [m:1] is calculated according to the calibration registers CALR1 [m:1] and CALR2 [m:1].

10. The circuit for width measurement of digital pulse signals according to claim 1 characterized in that wherein the relationship between a frequency f of the sample clock, the delay δ of the delay cells and the number i of the delay cells is as follows:

$1/f < i \times \delta$, wherein $i$ is a positive integer.

* * * * *